United States Patent
Im

(10) Patent No.: US 7,989,239 B2
(45) Date of Patent: Aug. 2, 2011

(54) LIGHT EMITTING DIODE AND METHOD OF MANUFACTURING THE SAME

(75) Inventor: Jin-seo Im, Seoul (KR)

(73) Assignee: Samsung LED Co., Ltd., Suwon, Gyunggi-do (KR)

( * ) Notice: Subject to any disclaimer, the term of this patent is extended or adjusted under 35 U.S.C. 154(b) by 70 days.

(21) Appl. No.: 12/470,976

(22) Filed: May 22, 2009

(65) Prior Publication Data

US 2009/0286339 A1 Nov. 19, 2009

(30) Foreign Application Priority Data

Feb. 1, 2006 (KR) .................. 10-2006-0009817

(51) Int. Cl.
*H01L 21/00* (2006.01)

(52) U.S. Cl. .......... 438/29; 257/E21.001; 438/604; 438/606

(58) Field of Classification Search ............ 438/29, 438/604, 606; 257/E21.001
See application file for complete search history.

(56) References Cited

U.S. PATENT DOCUMENTS

| | | | |
|---|---|---|---|
| 5,559,400 | A | 9/1996 | Nakayama et al. |
| 6,587,620 | B2 | 7/2003 | Koyama et al. |
| 2001/0028667 | A1 | 10/2001 | Kaneko |
| 2002/0018620 | A1* | 2/2002 | Koyama et al. .......... 385/37 |
| 2002/0030442 | A1* | 3/2002 | Koyama et al. .......... 313/504 |
| 2006/0066230 | A1* | 3/2006 | Kubota et al. .......... 313/506 |
| 2006/0090790 | A1* | 5/2006 | Kobayashi et al. .......... 136/256 |

FOREIGN PATENT DOCUMENTS

| | | |
|---|---|---|
| JP | 20065171 A | 1/2006 |
| KR | 200579279 A | 8/2005 |

OTHER PUBLICATIONS

Office Action issued in Korean Intellectual Property Office on Mar. 31, 2008 with English translation.

* cited by examiner

*Primary Examiner* — Hung Vu
*Assistant Examiner* — Vernon P Webb
(74) *Attorney, Agent, or Firm* — Buchanan Ingersoll & Rooney PC

(57) ABSTRACT

A light emitting diode having high light extraction efficiency and a method of manufacturing the same are provided. The LED includes a semiconductor multiple layer including an active layer; a transparent electrode layer formed on the semiconductor multiple layer; and refraction field unit embedded in the transparent electrode layer and formed of a material having a different refractive index than the transparent electrode layer. The method of manufacturing the LED includes: crystallizing and growing a semiconductor multiple layer having an active layer on a substrate; evaporating a first transparent electrode layer onto the semiconductor multiple layer; forming a plurality of grooves in the first transparent electrode layer by patterning and etching the first transparent electrode layer; and evaporating a second transparent electrode layer onto the first transparent electrode layer at an angle to the grooves to form cavities filled with air between the first transparent electrode layer and the second transparent electrode layer.

3 Claims, 7 Drawing Sheets

LIGHT EMITTING DIODE AND METHOD OF MANUFACTURING THE SAME

CROSS-REFERENCE TO RELATED PATENT APPLICATION

This application claims the benefit of Korean Patent Application No. 10-2006-0009817, filed on Feb. 1, 2006 in the Korean Intellectual Property Office, the disclosure of which is incorporated herein in its entirety by reference.

BACKGROUND OF THE DISCLOSURE

1. Field of the Disclosure

The present disclosure relates to a light emitting diode and a method of manufacturing the same, and more particularly, to a light emitting diode including a transparent electrode with an improved structure to improve the light extraction efficiency and a method of manufacturing the light emitting diode.

2. Description of the Related Art

A light emitting diode (LED) is formed of a light emitting source using compound semiconductors such as GaAs, AlGaN, and AlGaAs to generate various colors of light. Recently, with the realization of highly efficient red, blue, green and white light emitting diodes using nitride materials having excellent physical and chemical characteristics, the application range of the light emitting diodes has widened. LEDs can be more easily manufactured and controlled than semiconductor lasers and have longer lifetimes than fluorescent lamps, thus replacing fluorescent lamps as illumination light sources of the next generation display devices.

Examples of factors that determine the characteristics of LEDs are color, brightness, and light intensity, which are primarily determined by the compound semiconductor material used for the LED devices. Also, the light generated by an active layer of the LED must be effectively emitted to the outside, and this depends on the structure and the material of a transparent electrode or the package of the LED.

FIG. 1 is a cross-sectional view of a conventional LED. Referring to FIG. 1, the LED includes a sapphire substrate 11, and an n-type semiconductor layer 13, an active layer 15, a p-type semiconductor layer 17, and a transparent electrode 19 sequentially stacked on the sapphire substrate 17.

When a voltage is applied between the n-type semiconductor layer 13 and the p-type semiconductor layer 17, holes from the p-type semiconductor layer 17 and electrons from the n-type semiconductor layer 13 combine in the active layer 15 to emit light. The light is emitted through the transparent electrode 19 to the outside.

However, in the structure illustrated in FIG. 1, light extraction efficiency is low. Light extraction efficiency refers to the ratio of emitted light to generated light in the active layer. The low light extraction efficiency is caused by the difference between the refractive indices of the semiconductor layers and the surrounding material.

FIG. 2 illustrates the optical path of light emitted to the outside in the LED of FIG. 1. When the light emitted by the active layer is emitted to the outside, the light is refracted at a boundary surface 19a between the transparent electrode 19 and the outside. When light travels from the transparent electrode having a high refractive index to the material having a low refractive index at an incidence angle greater than a critical angle, light is totally reflected at the boundary surface 19a. The critical angle $\theta_c$ is given by Equation 1.

$$\theta_c = \sin^{-1}(n_2/n_1) \quad \text{Equation 1}$$

For example, when the transparent electrode 19 is formed of ITO with a refractive index of 2, and the surrounding material is air with a refractive index of 1, the critical angle is 30°. That is, only light having an incidence angle of less than 30° is emitted to the outside, and light having an incidence angle of 30° or greater is not emitted to the outside, thus resulting in low light extraction efficiency.

SUMMARY OF THE DISCLOSURE

The present invention may provide a light emitting diode with high light extraction efficiency and a method of manufacturing the same.

According to an aspect of the present invention, there may be provided a light emitting diode (LED) comprising: a semiconductor multiple layer comprising an active layer; a transparent electrode layer formed on the semiconductor multiple layer; and a refraction field unit embedded in the transparent electrode layer and formed of a material having a different refractive index than the transparent electrode layer.

According to an aspect of the present invention, there may be provided a method of manufacturing an LED comprising: forming a semiconductor multiple layer having an active layer on a substrate; evaporating a first transparent electrode layer onto the semiconductor multiple layer; forming a refraction layer on the first transparent electrode layer by evaporating a material having a different refractive index than the first transparent electrode layer onto the first transparent electrode layer; forming refraction field unit by patterning and etching the refraction layer; and embedding the refraction field unit by evaporating a second transparent electrode layer on the refraction field unit and the first transparent electrode layer.

According to another aspect of the present invention, there may be provided a method of manufacturing the LED of claim 6, the method comprising: forming a semiconductor multiple layer having an active layer on a substrate; evaporating a first transparent electrode layer onto the semiconductor multiple layer; forming a plurality of grooves in the first transparent electrode layer by patterning and etching the first transparent electrode layer; and evaporating a second transparent electrode layer onto the first transparent electrode layer at an angle to the grooves to form refraction field unit formed of air cavities filled with air between the first transparent electrode layer and the second transparent electrode layer.

BRIEF DESCRIPTION OF THE DRAWINGS

The above and other features and advantages of the present invention will be illustrated in detailed exemplary embodiments thereof with reference to the attached drawings in which.

DETAILED DESCRIPTION OF THE EXEMPLARY EMBODIMENTS

The present invention will now be described more fully with reference to the accompanying drawings, in which exemplary embodiments of the invention are shown.

Figure 3:
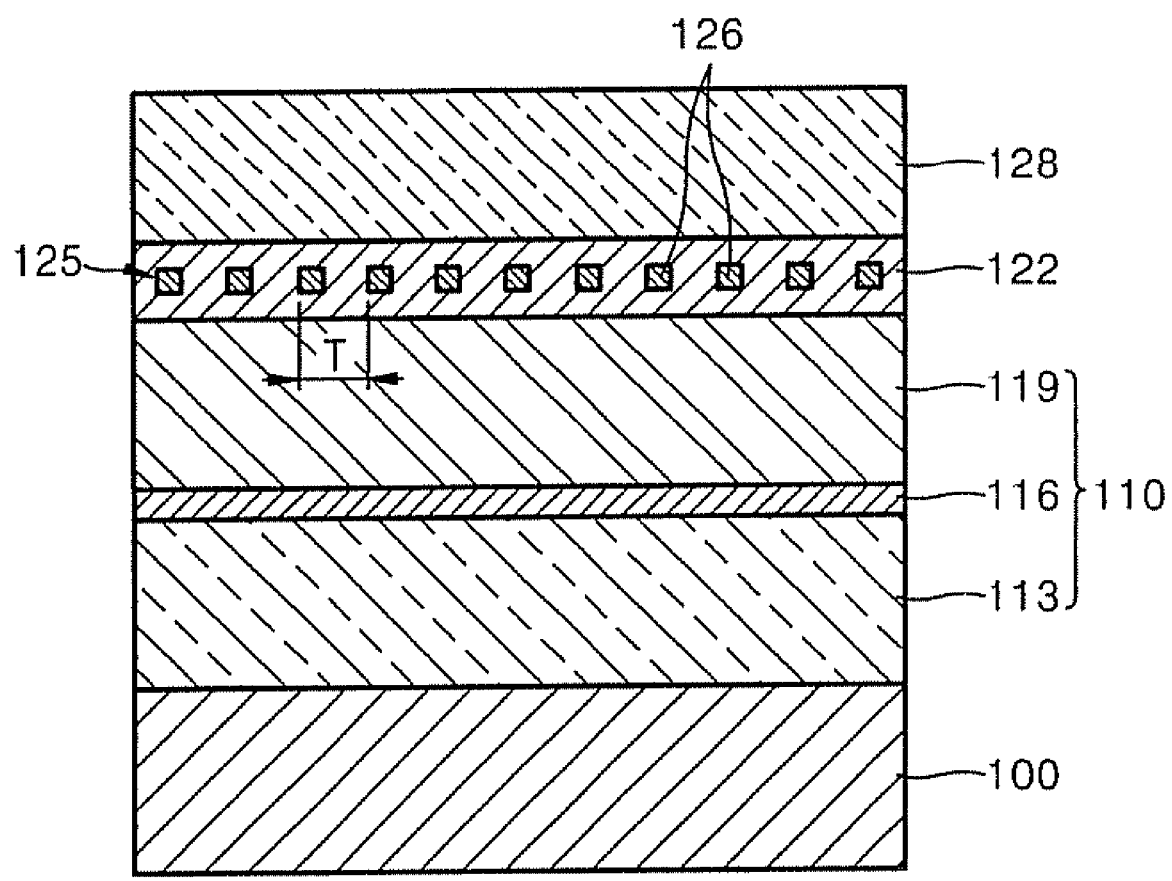
FIG. 3 is a cross-sectional view of an LED according to an embodiment of the present invention.

FIG. 3 is a cross-sectional view of a light emitting diode (LED) according to an embodiment of the present invention. Referring to FIG. 3, the LED includes a sapphire substrate 100, and a semiconductor multiple layer 110 and a transparent electrode layer 122 sequentially stacked on the sapphire substrate 100.

The semiconductor multiple layer 110 includes an n-type semiconductor layer 113, an active layer 116, and a p-type semiconductor layer 119. Each of the n-type semiconductor layer 113, the active layer 116, and the p-type semiconductor layer 119 may be formed of a compound semiconductor such as GaN.

Refraction field unit 125 is formed in the transparent electrode layer 122 to improve the efficiency of light emitted to the outside by refracting light generated by the active layer 116. The refraction field unit 125 may be formed of a material having a different refractive index than the transparent electrode layer or may be cavities filled with air.

The transparent electrode layer 122 may be formed of a material having high light transmittance with respect to light in the visible spectrum and high electrical conductivity. For example, indium tin oxide (ITO), tin oxide ($SnO_2$), or zinc oxide (ZnO) may be used.

When the light generated by the active layer 116 passes through the transparent electrode layer 122 and is emitted to the outside, the refraction field unit 125 increases the light extraction efficiency by refracting the light generated by the active layer 116, and thus, the refraction field unit 125 should be formed of a material having a different refractive index than the transparent electrode layer 122. Also, in order to increase this effect, the difference between the refractive indices of the refraction field unit 125 and the transparent electrode layer 122 can be great.

The refraction field unit 125 may be formed of a material having a smaller refractive index than the transparent electrode layer 122, for example, porous $SiO_2$, KDP, $NH_4H_2PO_4$, $CaCO_3$, $BaB_2O_4$, NaF, or $Al_2O_3$. Also, the material forming the refraction field unit 125 may have a greater refractive index than the transparent electrode layer 122, and may be SiC, $LiNbO_3$, $LiIO_3$, $PbMoO_4$, $Nb_2O_5$, $TiO_2$, or $ZrO_2$.

The refraction field unit 125 includes a plurality of refraction regions 126 and refraction regions 126 are arranged at regular intervals, T. However, the arrangement may also be irregular.

A resin layer 128 may be formed as a capping layer on the transparent electrode layer 122.

Figure 4A:
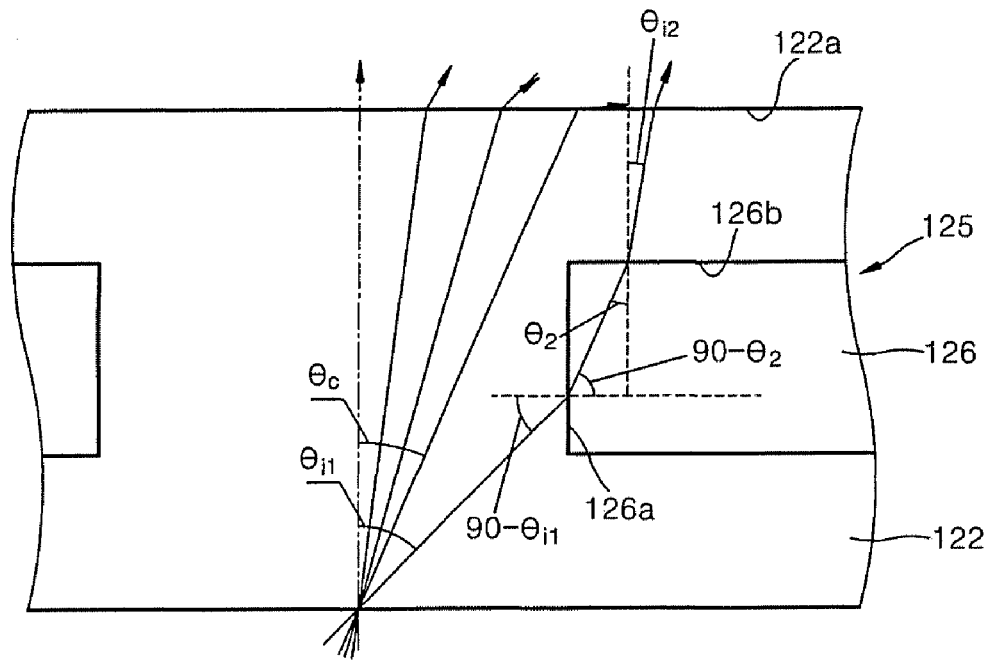
FIG. 4A is a schematic view illustrating the emission of light when the refractive index of refraction field unit is less than the refractive index of a transparent electrode layer in the LED of FIG. 3.
Figure 4B:
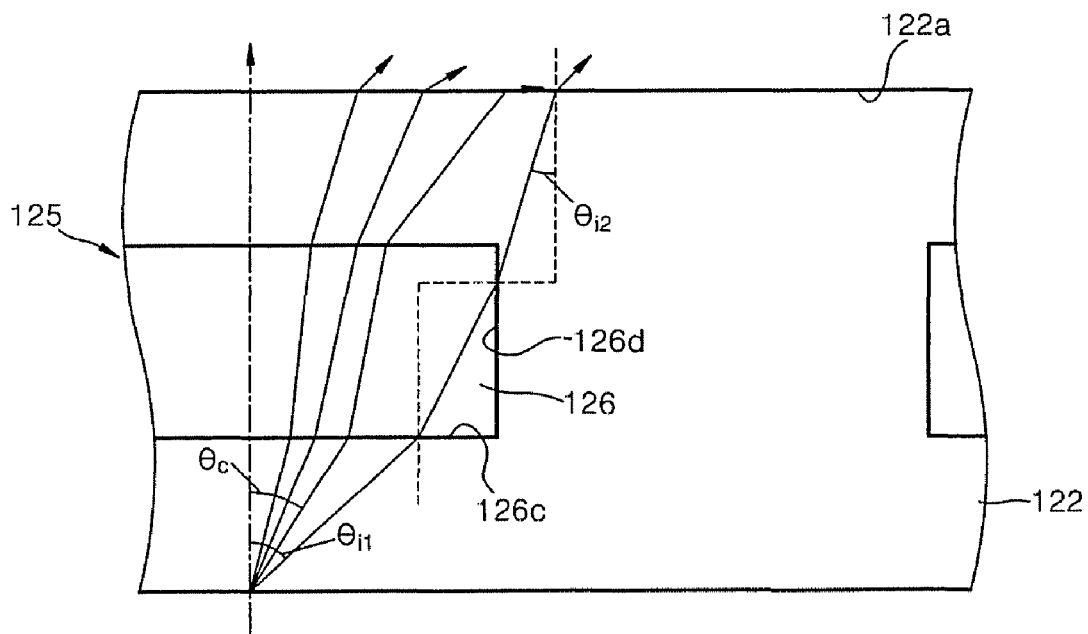
FIG. 4B is a schematic view illustrating the emission of light when the refractive index of refraction field unit is greater than the refractive index of a transparent electrode layer in the LED of FIG. 3.

FIGS. 4A and 4B illustrate the principle of increasing the light extraction efficiency of the light emitting diode according to an embodiment of the present invention. The light generated by the active layer 116 passes through the transparent electrode layer 122 and is emitted to the outside, and since the light having an incidence angle of less than the critical angle $\theta_c$ is not totally reflected, the light can be emitted to the outside. Also, in case that the incidence angle $\theta_{i1}$ is greater than the critical angle $\theta_c$, since the incidence angle $\theta_{i2}$ of light at the boundary surface 122a becomes smaller than the incidence angle $\theta_{i1}$ when the light reaches the boundary surface 122a passing through the refraction field unit 125, the light is more likely to be emitted to the outside instead of being totally reflected.

FIG. 4A is a schematic view illustrating light passing through the refraction field unit 125 when the refractive index of the refraction field unit 125 is less than the refractive index of the transparent electrode layer 122. The light having an incidence angle of $\theta_{i1}$ has an incidence angle of 90–$\theta_{i1}$ at a lateral surface 126a of one of the refraction regions 126. The refraction angle of the light at the lateral surface 126a is 90–$\theta_2$, which is greater than 90–$\theta_{i1}$ when the refractive index of the refraction field 126 is less than the refractive index of the transparent electrode layer 122. That is, $\theta_2$ is smaller than $\theta_{i1}$. Also, the incidence angle at an upper surface 126b of the refraction field 126 is $\theta_2$, and the refraction angle is $\theta_{i2}$, which is smaller than $\theta_2$.

Thus, the incidence angle $\theta_{i2}$ at the boundary surface 122a is smaller than the incident angle $\theta_{i1}$. When the incidence angle $\theta_{i2}$ is smaller than the critical angle $\theta_c$, the light can be emitted to the outside, thereby increasing the overall amount of the light emitted to the outside.

FIG. 4B illustrates the light passing through the refraction field unit 125 when the refractive index of the refraction field unit 125 is greater than the refractive index of the transparent electrode layer 122. Light having an incidence angle $\theta_{i1}$ greater than the critical angle $\theta_c$ passes through a surface 126c and a surface 126d of the refraction region 126 and is refracted, and thus the incidence angle $\theta_{i2}$ at the boundary surface 122a can be smaller than the critical angle $\theta_c$, thereby increasing the amount of the light emitted to the outside.

Figure 5:
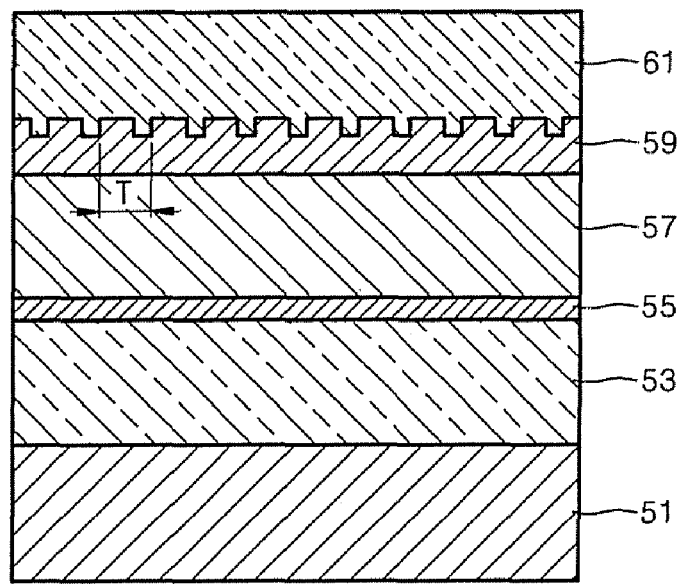
FIG. 5 is a cross-sectional view of a comparative example LED for comparison with the LED of FIG. 3.

FIG. 5 is a cross-sectional view of a conventional LED for comparison with the LED of the above described embodiment of the present invention. Referring to FIG. 5, the LED includes a sapphire substrate 51, and an n-type semiconductor layer 53, an active layer 55, a p-type semiconductor layer 57, a transparent electrode layer 59, and a resin layer 61 sequentially stacked on the sapphire substrate 51. A concavo-convex structure is formed on an upper surface of the transparent electrode layer 59 and has a period, T.

Figure 6:
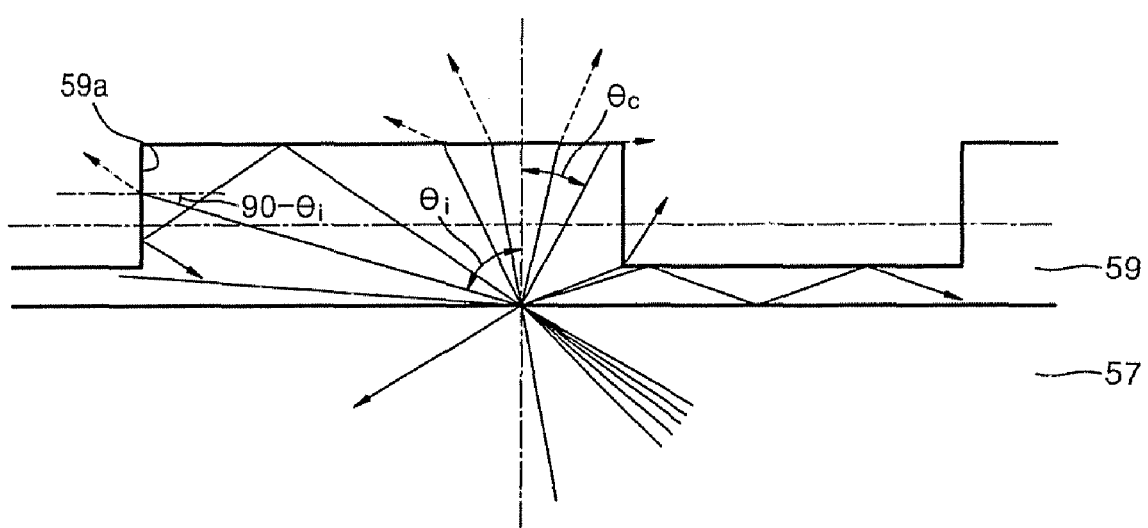
FIG. 6 is a schematic view illustrating the optical path of light in the LED of FIG. 5.

FIG. 6 is a schematic view illustrating the optical path of light in the LED of FIG. 5. Referring to FIG. 6, when light having an incidence angle $\theta_i$ passes through a lateral wall 59a on which a concavo-convex structure is formed and is emitted to the outside, the incidence angle $\theta_i$ of the light with respect to the lateral wall 59a is 90–$\theta_i$. Thus the light can be emitted to the outside when 90–$\theta_i$ is smaller than the critical angle, in addition to the case when the incidence angle $\theta_i$ is smaller than the critical angle $\theta_c$, thereby improving the light extraction efficiency.

Figure 7:
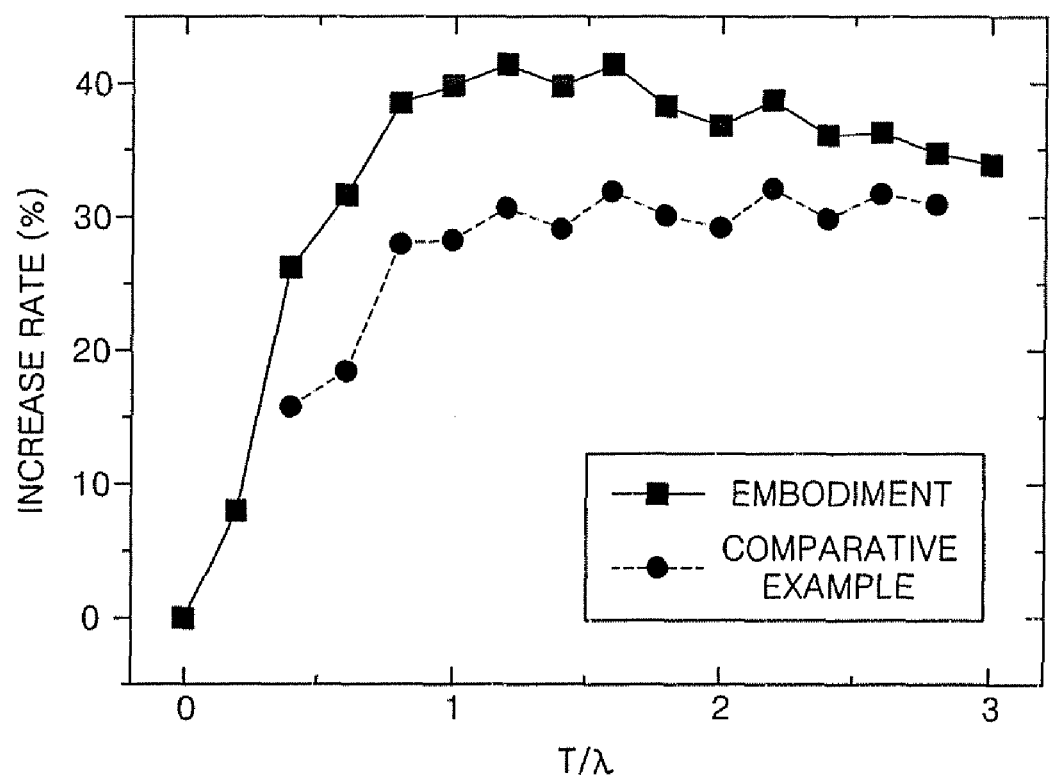
FIG. 7 is a graph of the increase rate of the light extraction efficiencies of the LEDs of FIGS. 3 and 5.

FIG. 7 is a graph of the results of a simulation of the increase rate of the light extraction efficiencies of the LEDs illustrated in FIGS. 3 and 5.

Figure 1:
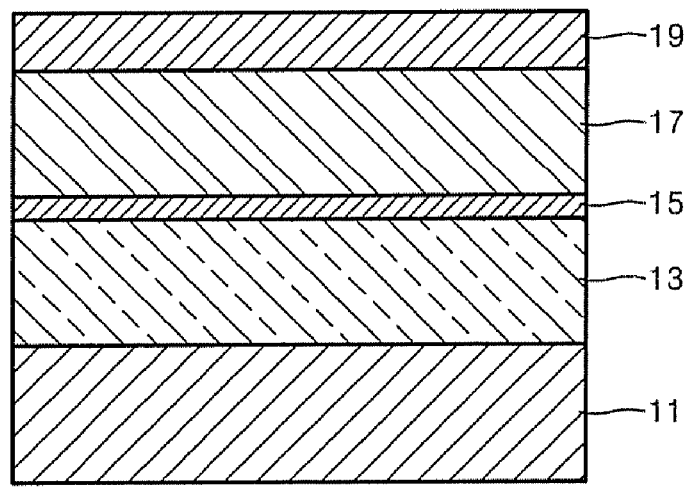
FIG. 1 is a cross-sectional view of a conventional light emitting diode (LED)
Figure 2:
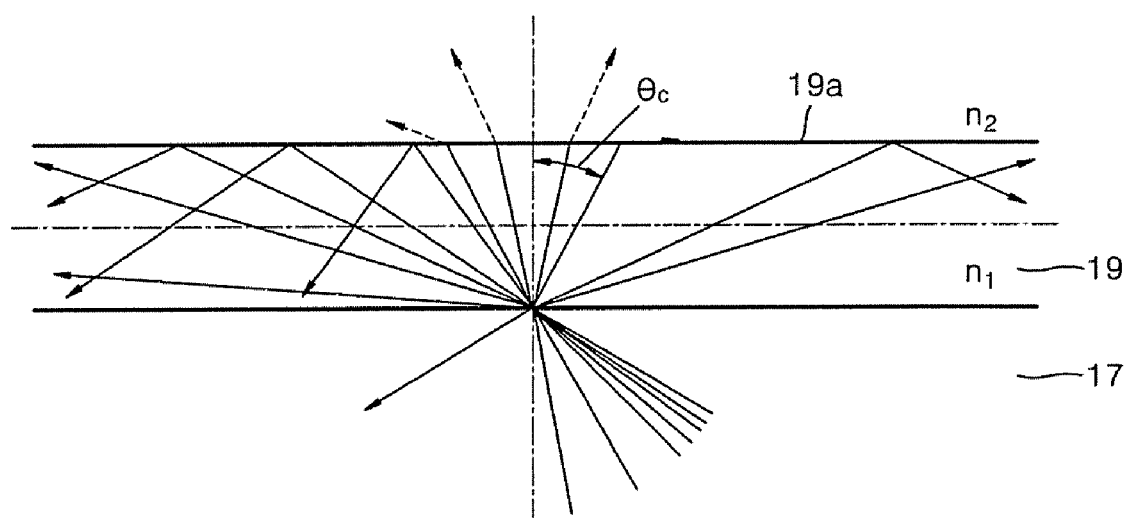
FIG. 2 illustrates the optical path of light emitted in the LED of FIG. 1.

Referring to FIG. 7, the increase rate of the light extraction efficiency is plotted against T/λ, wherein T denotes the period T of the refraction field unit 125 (see FIG. 3) or the concavo-convex structure(see FIG. 5), and λ denotes the wavelength of the light generated by the active layer. The increase rate is to the conventional LED (see FIG. 1). The dotted line denotes the results obtained from the comparative example LED of FIG. 5 and the solid line denotes results obtained from the LED according to an embodiment of the present invention illustrated in FIG. 3.

The simulation was conducted while increasing the value of $T/\lambda$. The transparent electrode layer was formed of ITO, and the refraction field unit was air cavities. That is, the refractive index of the transparent electrode layer was 2, and the refractive index of the refraction field unit was 1.

The maximum increase rate of the light extraction efficiency of the LED according to an embodiment of the present embodiment is 40% and is greater than the comparative example, too. In the comparative example of the conventional LED, when the transparent electrode 59 (see FIG. 5) is etched to form the concavo-convex structure, the transparent electrode may be damaged by the etching, and thus the quality of the electrode may be reduced in that the transparency of the transparent electrode layer may be decreased or the resistance thereof may be increased, and thus, the LED according to an embodiment of the present embodiment is improved and is advantageous relative to the comparative example LED.

In both cases, the increase rate of the light extraction efficiency increases as the value of $T/\lambda$ increases and saturates at a predetermined value of $T/\lambda$. When $T/\lambda$ is between 0 and 1, the light extraction efficiency increases quickly, and thereafter the light extraction efficiency is saturated. The light extraction efficiency of the LED according to an embodiment of the present invention is about 20% or higher than that of the conventional LED when $T/\lambda$ is greater than 0.5.

The simulation results are related to limited parameters and simulation can also be conducted with respect to other parameters, thereby enabling one to choose a structure for improving the light extraction efficiency. For example, the size of the refraction field unit 125 (see FIG. 3) or specific position of the transparent electrode layer 122 (see FIG. 3) may be determined.

FIGS. 8A through 8D are cross-sectional views illustrating a method of manufacturing an LED according to an embodiment of the present invention.

Figure 8A:
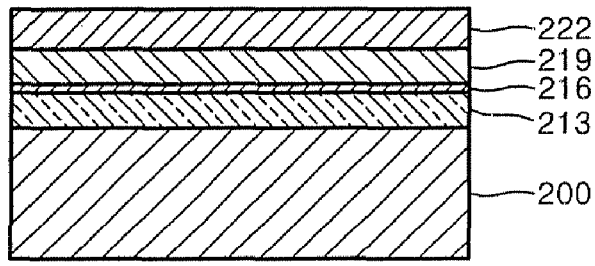
FIGS. 8A through 8D are cross-sectional views illustrating a method of manufacturing an LED according to an embodiment of the present invention.

First, referring to FIG. 8A, an n-type semiconductor layer 213, an active layer 216, and a p-type semiconductor layer 219 are formed on a sapphire substrate 200, and a first transparent electrode layer 222 is evaporated onto the p-type semiconductor layer 219.

Figure 8B:
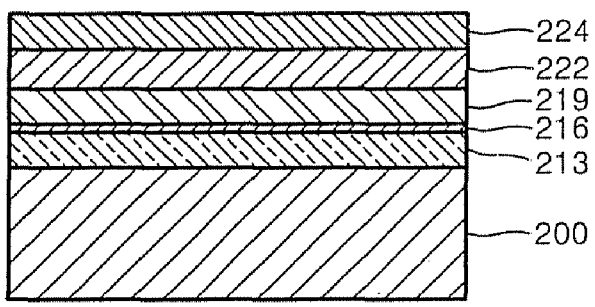
Figure 8C:
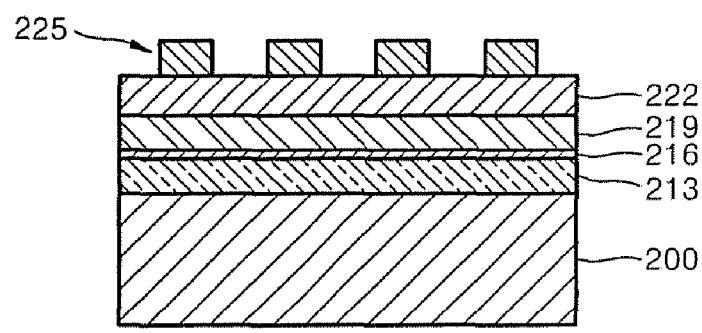

Next, referring to FIG. 8B, a refraction layer 224 having a different refractive index than the first transparent electrode layer 222 is evaporated onto the first transparent electrode layer 222. Then, referring to FIG. 8C, the refraction field unit 225 is formed using a patterning process and an etching process.

Figure 8D:
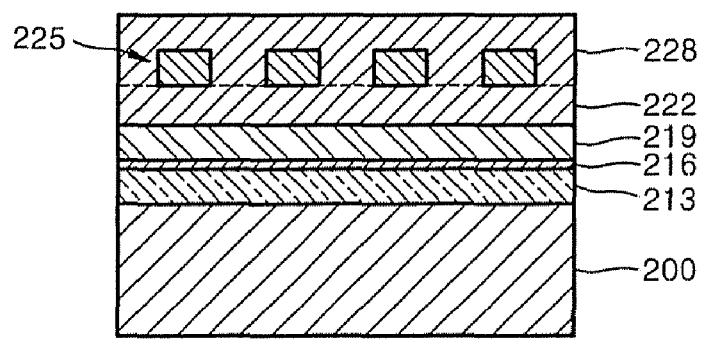

Referring to FIG. 8D, a second transparent electrode layer 228 is evaporated onto the first transparent electrode layer 222 on which the refraction field unit 225 is formed, thereby embedding the refraction field unit 225 into the first transparent electrode layer 222 and the second transparent electrode layer 228, thus completing the LED.

Figure 9A:
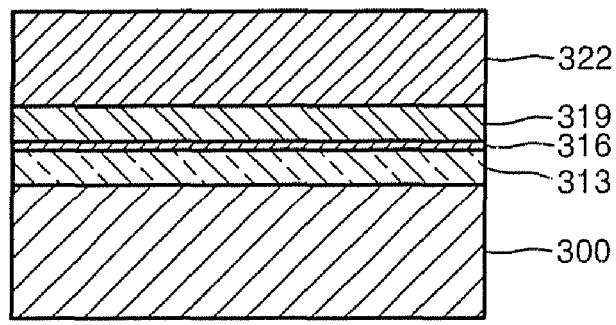
FIGS. 9A through 9C are cross-sectional views illustrating a method of manufacturing an LED according to another embodiment of the present invention.
Figure 9B:
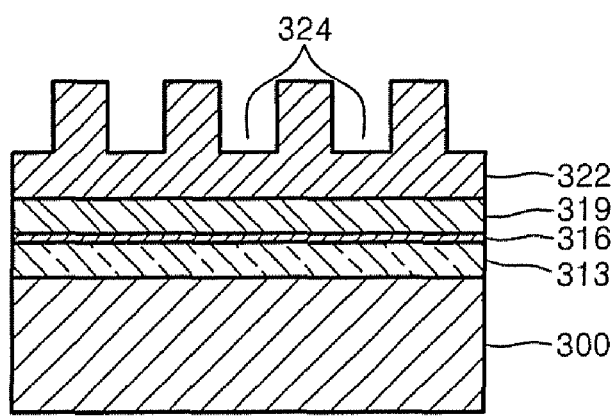
Figure 9C:
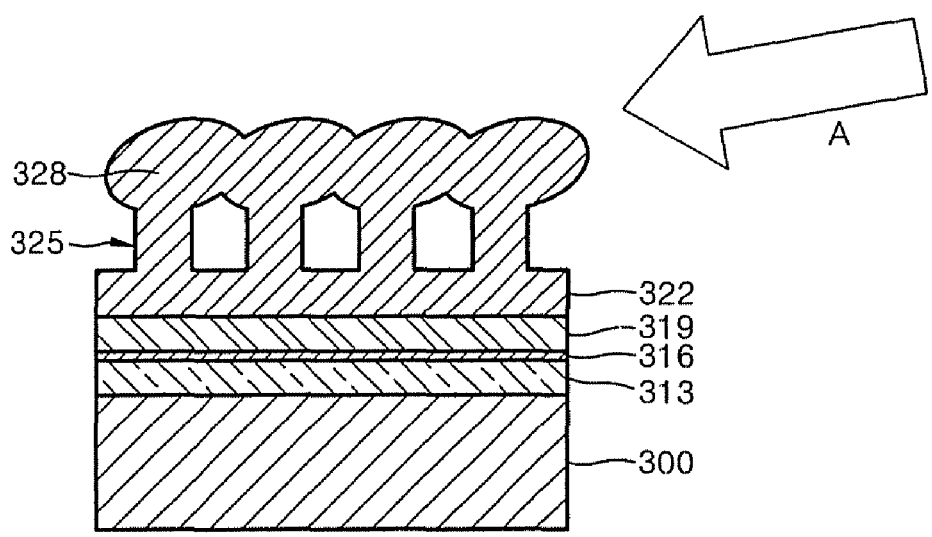

FIGS. 9A through 9C are cross-sectional views illustrating a method of manufacturing an LED according to another embodiment of the present invention.

Referring to FIG. 9A, an n-type semiconductor layer 313, an active layer 316, and a p-type semiconductor layer 319 are formed on a sapphire substrate 300, and then a first transparent electrode layer 322 is evaporated onto the p-type semiconductor layer 319. Next, referring to FIG. 9B, grooves 324 are formed in the evaporated first transparent electrode layer 322 using a patterning process and an etching process. Then, referring to FIG. 9C, a second transparent electrode layer 328 is evaporated using an e-beam evaporator. An arrow A denotes the direction in which an electron beam is evaporated. When the electron beam is evaporated at an angle to the grooves 324, a self-shadowing region where the electron beam is not incident is formed in the grooves 324. Accordingly, the grooves 324 are not filled with the second transparent electrode layer 328, and thus, an LED with air cavities as refraction field unit 325 is manufactured.

As described above, the LED according to the present invention includes a refraction field unit formed of a material having a different refractive index than the transparent electrode layer inside the transparent electrode layer and thus the light extraction efficiency of the light generated by the semiconductor active layer is high. Also, since the transparent electrode layer does not include a concavo-convex structure, there is no danger of the transparent electrode layer being damaged by etching, thereby ensuring a high transparency and a low resistance of the transparent electrode layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an LED comprising:
   forming a semiconductor multiple layer having an active layer on a substrate;
   evaporating a first transparent electrode layer onto the semiconductor multiple layer;
   forming a plurality of grooves in the first transparent electrode layer by patterning and etching the first transparent electrode layer; and
   evaporating a second transparent electrode layer onto the first transparent electrode layer at an angle to the grooves to form refraction field unit formed of cavities with air between the first transparent electrode layer and the second transparent electrode layer.

2. The method of claim 1, wherein the refraction field unit comprises a plurality of refraction regions arranged at predetermined intervals in the transparent electrode layer.

3. The method of claim 2, wherein the interval of the refraction regions is at least 0.5 times the wavelength of light generated by the active layer.

* * * * *